(12) United States Patent
Meyer et al.

(10) Patent No.: US 7,952,200 B2
(45) Date of Patent: May 31, 2011

(54) SEMICONDUCTOR DEVICE INCLUDING A COPOLYMER LAYER

(75) Inventors: Thorsten Meyer, Regensburg (DE); Recai Sezi, Rötten bach (DE)

(73) Assignee: Infineon Technologies AG, Neubiberg (DE)

( * ) Notice: Subject to any disclaimer, the term of this patent is extended or adjusted under 35 U.S.C. 154(b) by 284 days.

(21) Appl. No.: 12/174,155

(22) Filed: Jul. 16, 2008

(65) Prior Publication Data

US 2010/0013091 A1 Jan. 21, 2010

(51) Int. Cl.
*H01L 23/48* (2006.01)
(52) U.S. Cl. .................. 257/773; 257/E23.019; 438/666
(58) Field of Classification Search .................. 257/773, 257/737, E23.019; 438/666
See application file for complete search history.

(56) References Cited

U.S. PATENT DOCUMENTS

| | | | |
|---|---|---|---|
| 5,244,833 A | 9/1993 | Gansauge et al. | |
| 6,011,314 A | 1/2000 | Leibovitz et al. | |
| 6,696,319 B2 | 2/2004 | Frankowsky et al. | |
| 6,762,117 B2 | 7/2004 | Lam et al. | |
| 6,919,264 B2 | 7/2005 | Brintzinger et al. | |
| 7,294,933 B2 | 11/2007 | Hanaoka | |
| 2003/0087189 A1* | 5/2003 | Takagi et al. | 430/280.1 |
| 2005/0012225 A1 | 1/2005 | Choi et al. | |
| 2006/0163728 A1* | 7/2006 | Nakanishi et al. | 257/738 |
| 2006/0289991 A1 | 12/2006 | Morita et al. | |
| 2007/0069346 A1 | 3/2007 | Lin et al. | |
| 2007/0200239 A1 | 8/2007 | Su | |
| 2007/0205520 A1* | 9/2007 | Chou et al. | 257/780 |
| 2007/0262436 A1* | 11/2007 | Kweon et al. | 257/686 |

OTHER PUBLICATIONS

"Embedded Wafer Level Ball Grid Array", M. Brunnbauer, et al., Electronics Packing Technology Conference, IEEE 2006 (5 pgs).

* cited by examiner

*Primary Examiner* — Tu-Tu V Ho
(74) *Attorney, Agent, or Firm* — Dicke, Billig & Czaja, P.L.L.C.

(57) ABSTRACT

A semiconductor device including a chip including an integrated circuit, a conductive layer, a copolymer layer and metal elements. The conductive layer is disposed over the chip and electrically coupled to the integrated circuit. The copolymer is disposed on the conductive layer. The metal elements are electrically coupled to the conductive layer via through-connects in the copolymer layer.

9 Claims, 8 Drawing Sheets

SEMICONDUCTOR DEVICE INCLUDING A COPOLYMER LAYER

BACKGROUND

Wafer level packaging (WLP) refers to the technology of packaging semiconductor chips at the wafer level, instead of the traditional process of packaging semiconductor chips one at a time. WLP is a chip-scale packaging technology, since the resulting package is substantially the same size as the chip. WLP consists of extending wafer fabrication processes to provide device connections and protection.

Wafer level ball grid array (WLB) packaging is one type of WLP. Typically, a semiconductor device fabricated using WLB technology includes a semiconductor chip or die electrically coupled to an array of solder balls or bumps via a redistribution layer (RDL). The solder balls or bumps are situated within the footprint of the semiconductor chip. A semiconductor device fabricated using WLB technology is coupled to a printed circuit board (PCB) by soldering the solder balls to the PCB.

Embedded wafer level ball grid array (eWLB) packaging expands on WLB packaging by providing the ability to add surface area to the footprint of the semiconductor chip. In eWLB packaging, a mold material or compound encapsulates the semiconductor chip opposite the RDL and the array of solder balls. This mold material expands the surface area that can be used for solder balls or bumps. A semiconductor device fabricated using eWLB technology is coupled to a PCB by soldering the solder balls to the PCB.

Typically, each of the semiconductor devices fabricated via either WLB technology or eWLB technology includes multiple layers applied via thin-film technologies. One layer is an insulating layer that pacifies the wafer. Another layer is a RDL that routes chip inputs and outputs to solder landing pads, and a third layer is a solder stop layer that stops solder flow and protects the RDL from oxidation and corrosion. Usually, the solder stop layer is a certain thickness to stop solder flow and prevent cracking of the solder stop layer.

Increasing the thickness of the insulating layer improves the operation of the integrated circuit on the semiconductor chip. However, increasing the thickness of the multiple layers increases stress on the semiconductor chip and warping of the semiconductor device. Increased warping of the semiconductor device may prevent pick and place tools from operating properly.

For these and other reasons, there is a need for the present invention.

SUMMARY

One embodiment described in the disclosure provides a semiconductor device including a chip including an integrated circuit, a conductive layer, a copolymer layer and metal elements. The conductive layer is disposed over the chip and electrically coupled to the integrated circuit. The copolymer is disposed on the conductive layer. The metal elements are electrically coupled to the conductive layer via through-connects in the copolymer layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
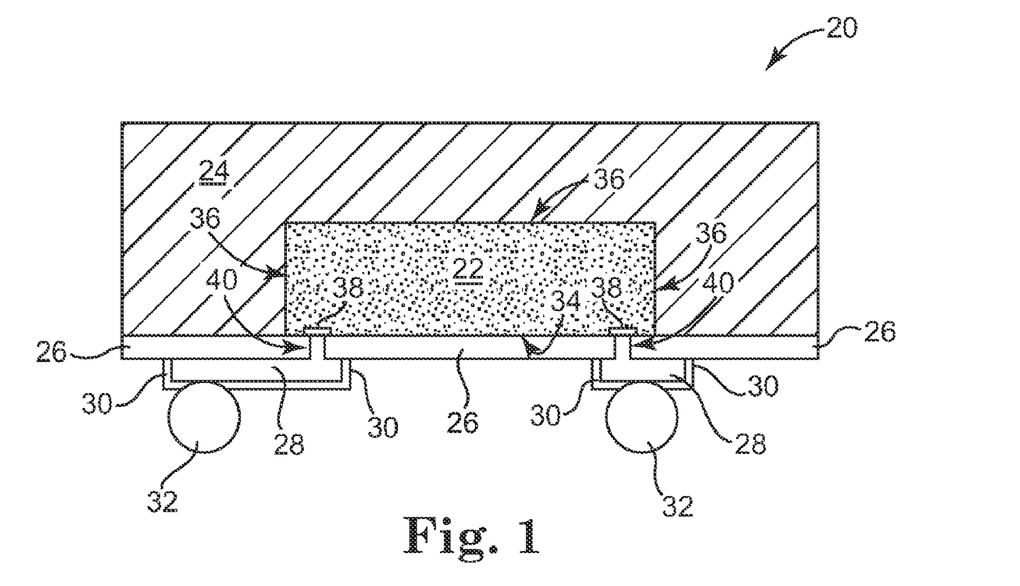
FIG. 1 is a diagram illustrating one embodiment of a semiconductor device manufactured via an eWLB technology.

FIG. 1 is a diagram illustrating one embodiment of a semiconductor device 20 manufactured via an eWLB technology. Semiconductor device 20 includes a semiconductor chip 22, mold material 24, an insulating layer 26, a conductive layer 28, a copolymer layer 30 and metal elements 32. Semiconductor device 20 is soldered to a PCB (not shown) via metal elements 32.

Semiconductor chip 22 includes an input/output (I/O) contact side 34 and other sides 36. Semiconductor chip 22 includes one or more integrated circuits having I/O contacts 38 on contact side 34. Mold material 24 is disposed on the other sides 36. In one embodiment, semiconductor chip 22 includes one or more integrated circuits substantially on contact side 34.

Insulating layer 26 is disposed over contact side 34 and portions of mold material 24. In one embodiment, insulating layer 26 includes a polyimide material. In one embodiment, semiconductor chip 22 includes a hard passivation layer, such as silicon dioxide or silicon nitride, on contact side 34.

Conductive layer 28 is disposed on insulating layer 26 and electrically coupled to I/O contacts 38 via through-connects at 40 in insulating layer 26. Conductive layer 28 extends over portions of semiconductor chip 22 and portions of mold material 24. Conductive layer 28 fans-out the I/O contacts 38 of semiconductor chip 22 to a surface area that is greater than the surface area of semiconductor chip 22, where more metal elements 32 can be accommodated via the greater surface area. In one embodiment, conductive layer 28 is disposed on insulating layer 26 and electrically coupled to I/O contacts 38 via through-connects at 40 in insulating layer 26 and in a hard passivation layer. In one embodiment, conductive layer 28 is a RDL including a seed layer. In one embodiment, conductive layer 28 is substantially copper.

Copolymer layer 30 is disposed on conductive layer 28. Copolymer layer 30 operates as a solder stop and protects conductive layer 28 from corrosion. In one embodiment, copolymer layer 30 has a thickness of less than 1 micrometer. In one embodiment, conductive layer 28 includes structured copper and copolymer layer 30 is disposed on the structured copper. In one embodiment, copolymer layer 30 includes copper and polyimide material. In one embodiment, conductive layer 28 includes copper and copolymer layer 30 is provided via putting polyimide on the copper and removing the polyimide.

Metal elements 32 are connected and electrically coupled to conductive layer 28 via through-connects in copolymer layer 30. In one embodiment, metal elements 32 protrude from conductive layer 28 at least 100 micrometers. In one embodiment, metal elements 32 are solder balls. In one embodiment, metal elements 32 are solder bumps. In one embodiment, metal elements 32 are solder studs.

Figure 2:
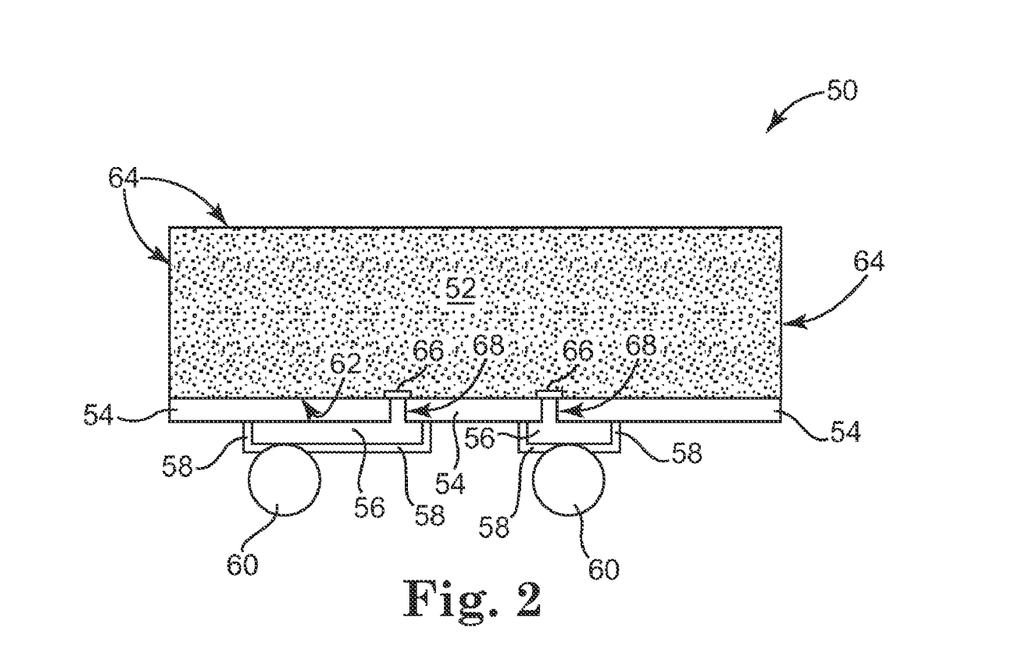
FIG. 2 is a diagram illustrating one embodiment of a semiconductor device manufactured via a WLB technology

FIG. 2 is a diagram illustrating one embodiment of a semiconductor device 50 manufactured via a WLB technology. Semiconductor device 50 includes a semiconductor chip 52, an insulating layer 54, a conductive layer 56, a copolymer layer 58 and metal elements 60. Semiconductor device 50 is soldered to a PCB (not shown) via metal elements 60.

Semiconductor chip 52 includes an I/O contact side 62 and other sides 64. Semiconductor chip 52 includes one or more integrated circuits having I/O contacts 66 on contact side 62. In one embodiment, semiconductor chip 52 includes one or more integrated circuits substantially on contact side 62.

Insulating layer 54 is disposed over contact side 62. In one embodiment, insulating layer 54 includes a polyimide material. In one embodiment, semiconductor chip 52 includes a hard passivation layer, such as silicon dioxide or silicon nitride, on contact side 62.

Conductive layer 56 is disposed on insulating layer 54 and electrically coupled to I/O contacts 66 via through-connects at 68 in insulating layer 54. Conductive layer 56 extends over portions of semiconductor chip 52. Conductive layer 56 fans-in metal elements 60 to I/O contacts 66, where metal elements 60 are distributed in the footprint of semiconductor chip 52. In one embodiment, conductive layer 56 is disposed on insulating layer 54 and electrically coupled to I/O contacts 66 via through-connects at 68 in insulating layer 54 and in a hard passivation layer. In one embodiment, conductive layer 56 is a RDL including a seed layer. In one embodiment, conductive layer 56 is substantially copper.

Copolymer layer 58 is disposed on conductive layer 56. Copolymer layer 58 operates as a solder stop and protects conductive layer 56 from corrosion. In one embodiment, copolymer layer 58 has a thickness of less than 1 micrometer. In one embodiment, conductive layer 56 includes structured copper and copolymer layer 58 is disposed on the structured copper. In one embodiment, copolymer layer 58 includes copper and polyimide material. In one embodiment, conductive layer 56 includes copper and copolymer layer 58 is provided via putting polyimide on the copper and removing the polyimide.

Metal elements 60 are connected and electrically coupled to conductive layer 56 via through-connects in copolymer layer 58. In one embodiment, metal elements 60 protrude from conductive layer 56 at least 100 micrometers. In one embodiment, metal elements 60 are solder balls. In one embodiment, metal elements 60 are solder bumps. In one embodiment, metal elements 60 are solder studs.

FIGS. 3-15 are diagrams illustrating one embodiment of a method of manufacturing semiconductor devices similar to semiconductor device 20 of FIG. 1. FIGS. 3-7 are diagrams illustrating one embodiment of a method of manufacturing a molded body 104 including embedded semiconductor chips 22 and mold material 24.

Figure 3:
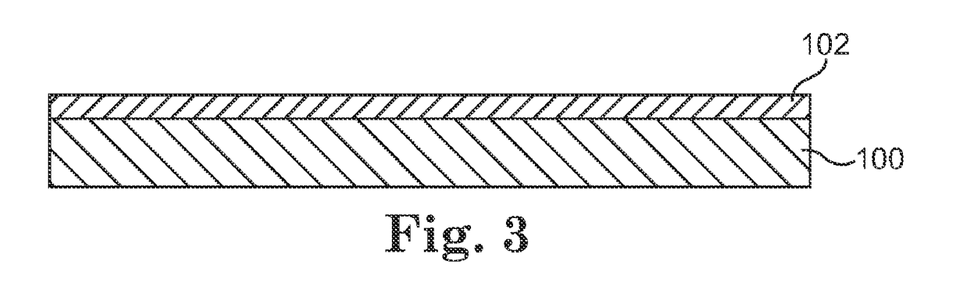
FIG. 3 is a diagram illustrating one embodiment of a wafer carrier and double sided sticky tape.

FIG. 3 is a diagram illustrating one embodiment of a wafer carrier 100 and double sided sticky tape 102. In one embodiment, wafer carrier 100 is a metal carrier plate. In one embodiment, wafer carrier 100 includes a glass layer.

Double sided sticky tape 102 is laminated on wafer carrier 100. Double sided sticky tape 102 is less stiff upon exposure to temperature than wafer carrier 100 and double sided sticky tape 102 supports the assembly during molding. In addition, double sided sticky tape 102 includes thermo-release properties, which allow the removal of wafer carrier 100 and double sided sticky tape 102 after molding.

Figure 4:
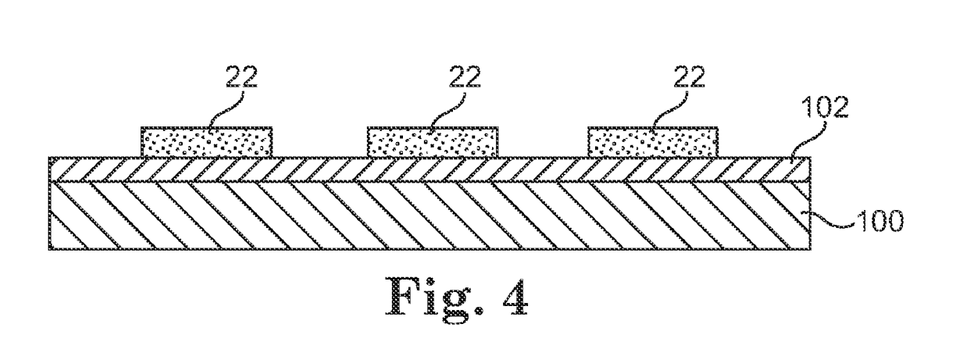
FIG. 4 is a diagram illustrating one embodiment of semiconductor chips on double sided sticky tape.

FIG. 4 is a diagram illustrating one embodiment of semiconductor chips 22 on double sided sticky tape 102. The semiconductor chips 22 come from one or more semiconductor wafers, which are diced to provide the semiconductor chips 22. Each of the semiconductor chips 22 includes at least one integrated circuit and I/O contacts. The semiconductor chips 22 are picked and placed onto the double sided sticky tape 102 with the I/O contacts down on the double sided sticky tape 102. In one embodiment, each of the semiconductor chips 22 are previously tested to be good die prior to being placed on the double sided sticky tape 102.

Figure 5:
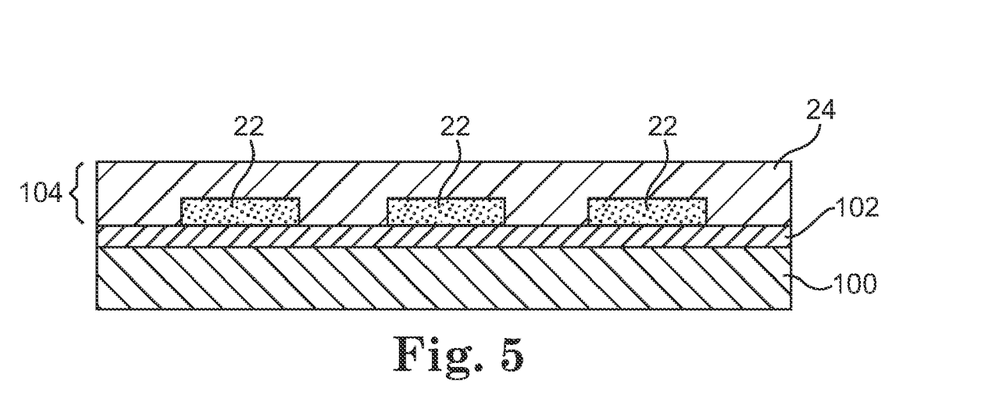
FIG. 5 is a diagram illustrating one embodiment of mold material on semiconductor chips and double sided sticky tape.

FIG. 5 is a diagram illustrating one embodiment of mold compound or material 24 on semiconductor chips 22 and double sided sticky tape 102. Mold material 24 is put on in liquid form to encapsulate the mounted semiconductor chips 22. Mold material 24 hardens to become part of a molded body 104 that includes mold material 24 and semiconductor chips 22. In one embodiment, mold material 24 is put on via compression molding. In one embodiment, mold material 24 is put on via transfer molding.

Figure 6:
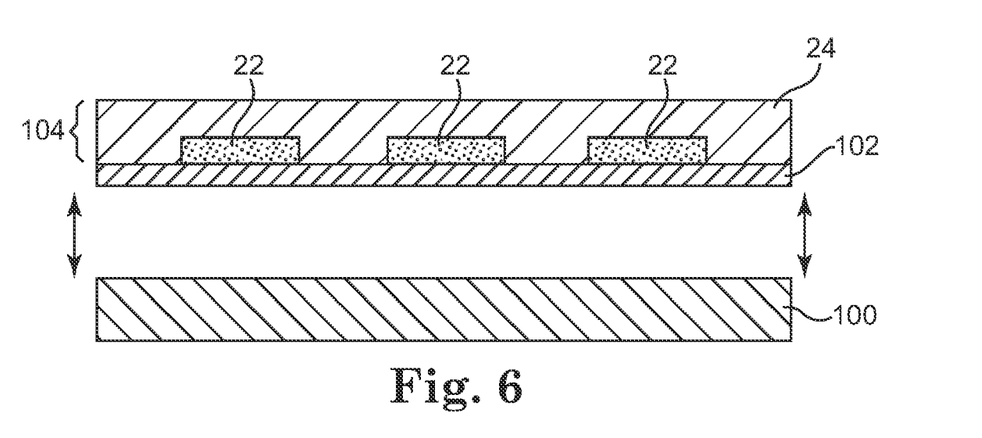
FIG. 6 is a diagram illustrating a wafer carrier separated from double sided sticky tape.

FIG. 6 is a diagram illustrating wafer carrier 100 separated from double sided sticky tape 102. Molded body 104, including mold material 24 and semiconductor chips 22, remains attached to double sided sticky tape 102.

Figure 7:
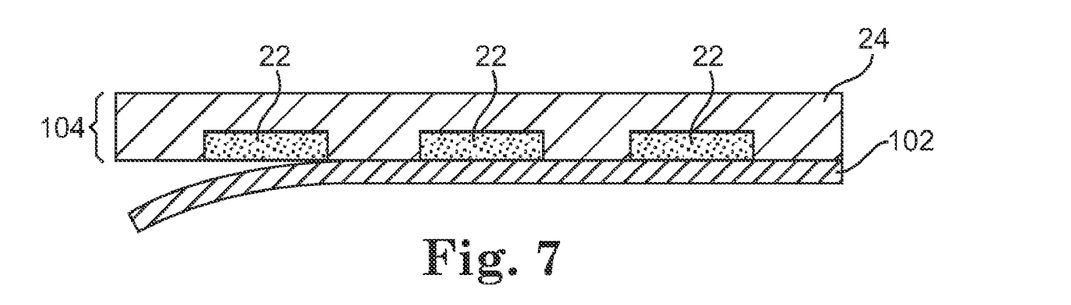
FIG. 7 is a diagram illustrating double sided sticky tape separated from a molded body.

FIG. 7 is a diagram illustrating double sided sticky tape 102 separated from molded body 104. In one embodiment, molded body 104 is the shape of a semiconductor wafer. In one embodiment, molded body 104 is the shape and size of a 200 millimeter semiconductor wafer.

FIGS. 8-15 are diagrams illustrating one embodiment of a wafer level method of connecting ball grid arrays to embedded semiconductor chips 22. In FIGS. 8-15 molded body 104 is rotated 180 degrees as compared to molded body 104 shown in FIG. 7.

Figure 8:
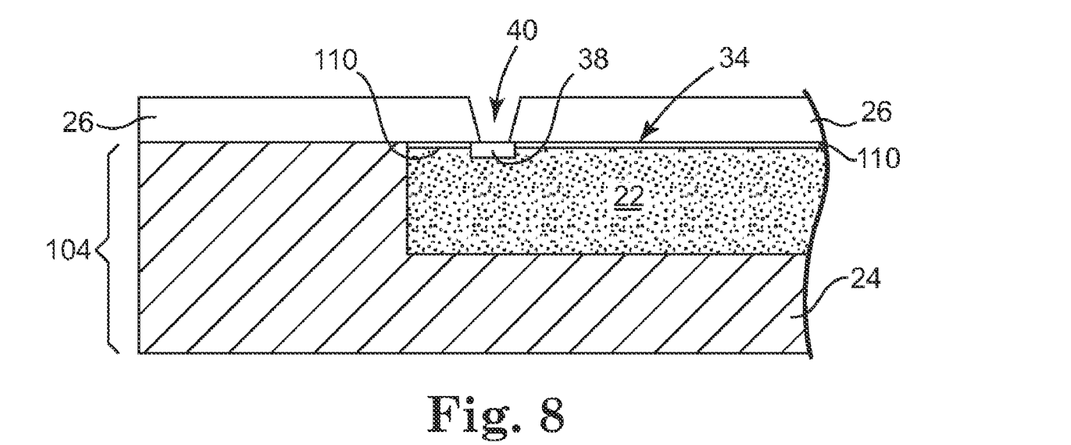
FIG. 8 is a diagram illustrating one embodiment of an insulating layer on a molded body.

FIG. 8 is a diagram illustrating one embodiment of an insulating layer 26 on molded body 104. Semiconductor chip 22 is embedded in mold material 24 and includes an I/O contact 38 and a hard passivation layer 110. In one embodiment, I/O contact 38 is an aluminum pad on semiconductor chip 22. In one embodiment hard passivation layer 110 includes silicon oxide. In one embodiment hard passivation layer 110 includes silicon nitride.

Insulating layer 26 is applied over mold material 24 and the contact side 34 of semiconductor chip 22. A through-connect at 40 is opened in insulating layer 26 via one or more photolithography steps. The through-connect at 40 is opened down to I/O contact 38. In one embodiment, insulating layer 26 is spun on and soft baked and the through-connect at 40 is developed before curing insulating layer 26. In one embodiment, the through-connect at 40 is etched through insulating layer 26. In one embodiment, insulating layer 26 is a polyimide.

Figure 9:
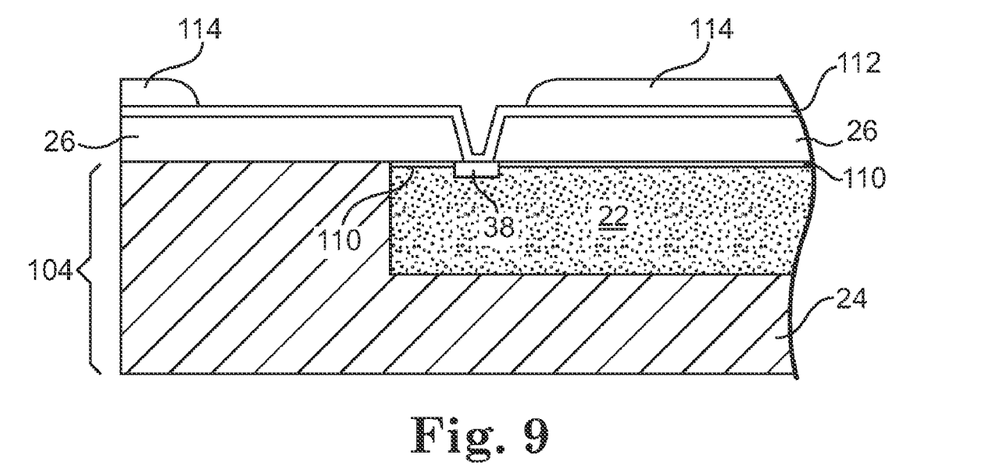
FIG. 9 is a diagram illustrating one embodiment of a seed layer and plating resists over an insulating layer and an I/O contact.

FIG. 9 is a diagram illustrating one embodiment of a seed layer 112 and plating resist 114 over insulating layer 26 and I/O contact 38. Seed layer 112 is applied over insulating layer 26 and through the through-connect at 40 to I/O contact 38. Seed layer 112 promotes adhesion and serves as a barrier layer.

In one embodiment, seed layer 112 includes a titanium-tungsten adhesion promoter and barrier layer. In one embodiment, seed layer 112 includes a copper layer. In one embodiment, seed layer 112 includes a titanium-tungsten adhesion promoter and barrier layer that is sputtered on insulating layer 26 and through the through-connect at 40 to contact I/O contact 38. In one embodiment, seed layer 112 includes a copper layer that is sputtered over a titanium-tungsten adhesion promoter and barrier layer.

Next, a plating resist 114 is applied over seed layer 112. Plating resist 114 is opened to expose seed layer 112 in one or more photolithography steps.

Figure 10:
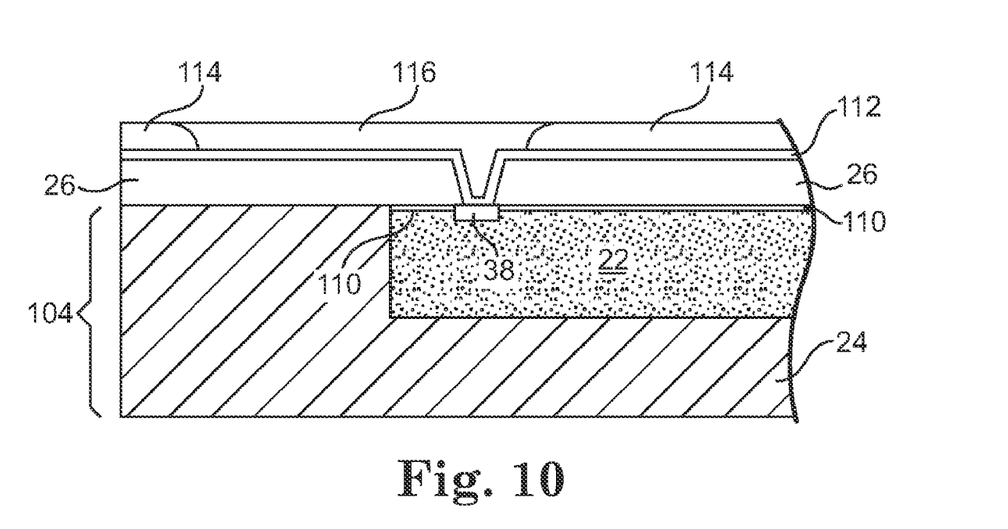
FIG. 10 is a diagram illustrating one embodiment of a metal layer situated on a seed layer and in the opening in a plating resist.

FIG. 10 is a diagram illustrating one embodiment of a metal layer 116 situated on seed layer 112 and in the opening in plating resist 114. Metal layer 116 is applied over plating resist 114 and seed layer 112. Metal layer 116 adheres to the exposed seed layer 112 to substantially fill the opening in plating resist 114. In one embodiment, metal layer 116 is substantially 6 micrometers thick. In one embodiment, metal layer 116 is copper. In one embodiment, metal layer 116 is electro-plated copper. In one embodiment, metal layer 116 is copper that is substantially 6 micrometers thick.

Figure 11:
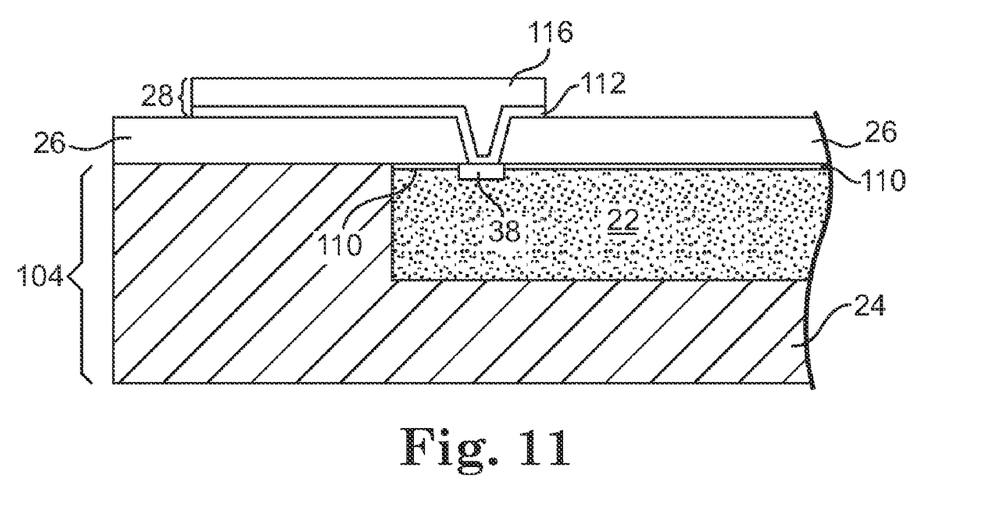
FIG. 11 is a diagram illustrating one embodiment of a conductive layer over an insulating layer and an I/O contact.

FIG. 11 is a diagram illustrating one embodiment of conductive layer 28 over insulating layer 26 and I/O contact 38. Plating resist 114 is stripped to expose seed layer 112, and metal layer 116 and seed layer 112 are etched to form conductive layer 28. Conductive layer 28 is electrically coupled to I/O contact 38 and the integrated circuit in semiconductor chip 22. Conductive layer 28 is an RDL.

Figure 12:
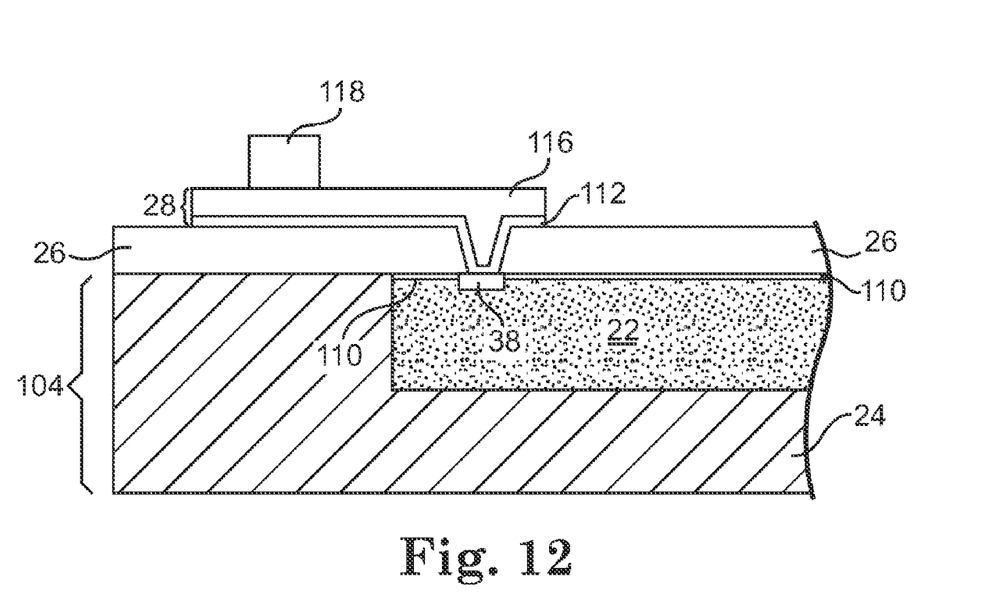
FIG. 12 is a diagram illustrating one embodiment of a masking layer or plating resist on a conductive layer.

FIG. 12 is a diagram illustrating one embodiment of a masking layer, plating resist 118 on conductive layer 28. Plating resist 118 is applied via selectively irradiating plating resist 118. Plating resist 118 protects conductive layer 28 from being coated with material in later steps of the process. Plating resist 118 is a masking layer that protects a landing pad area used to attach metal elements 32.

Figure 13:
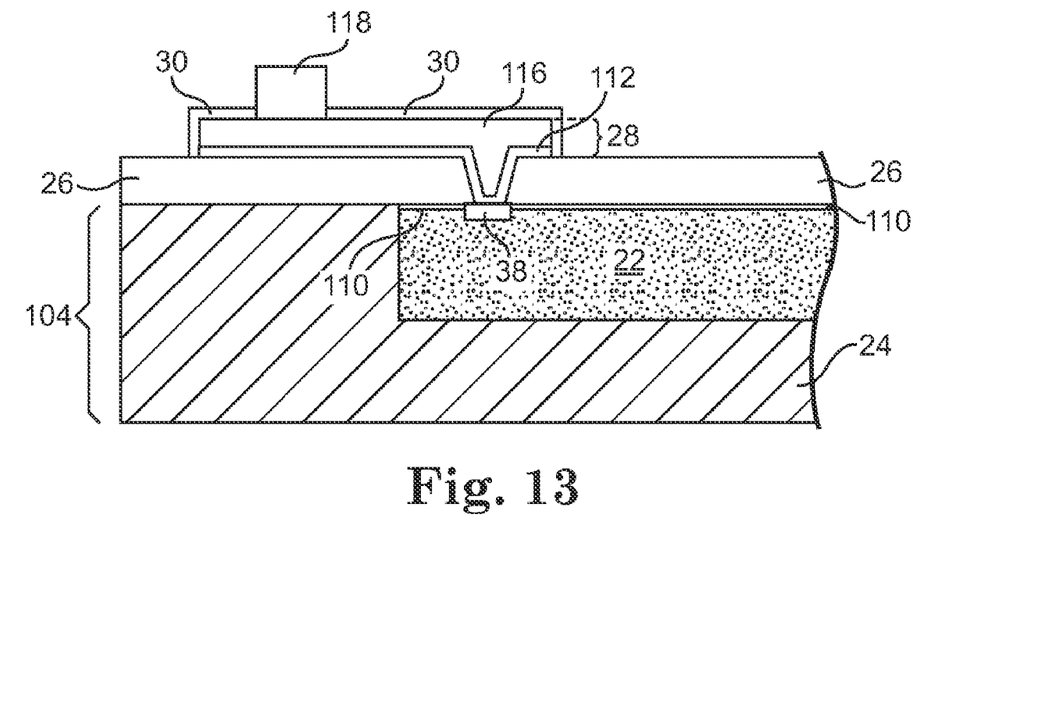
FIG. 13 is a diagram illustrating one embodiment of copolymer layer on a conductive layer.

FIG. 13 is a diagram illustrating one embodiment of copolymer layer 30 on conductive layer 28. Copolymer layer 30 adheres to and is part of metal layer 116 and seed layer 112. Copolymer layer 30 is non-wettable by solder material and operates as a solder stop, such that solder does not adhere to copolymer layer 30. Also, copolymer layer 30 is stable, such that copolymer layer 30 cannot be removed via any etching or plasma step short of etching away at least part of conductive layer 28. In one embodiment, copolymer layer 30 is less than 1 micrometer thick.

In one embodiment, metal layer 116 and seed layer 112 include copper and a polyimide material is applied over the metal layer 116 and seed layer 112 and insulating layer 26. The polyimide material reacts with copper to form a copolymer layer 30 between the copper and polyimide material on conductive layer 28, including on the edges of conductive layer 28. Copolymer layer 30 does not form where plating resist 118 protects the copper of conductive layer 28, i.e. the landing pad for one of the metal elements 32. Next, a soft bake is performed to support the reaction and the residual polyimide material is removed via spin-off with developer solvent. The remaining copolymer layer 30 is less than 1 micrometer.

In one embodiment, polyimide material is spun on to form copolymer layer 30. In one embodiment, polyimide material is sprayed on to form copolymer layer 30.

Figure 14:
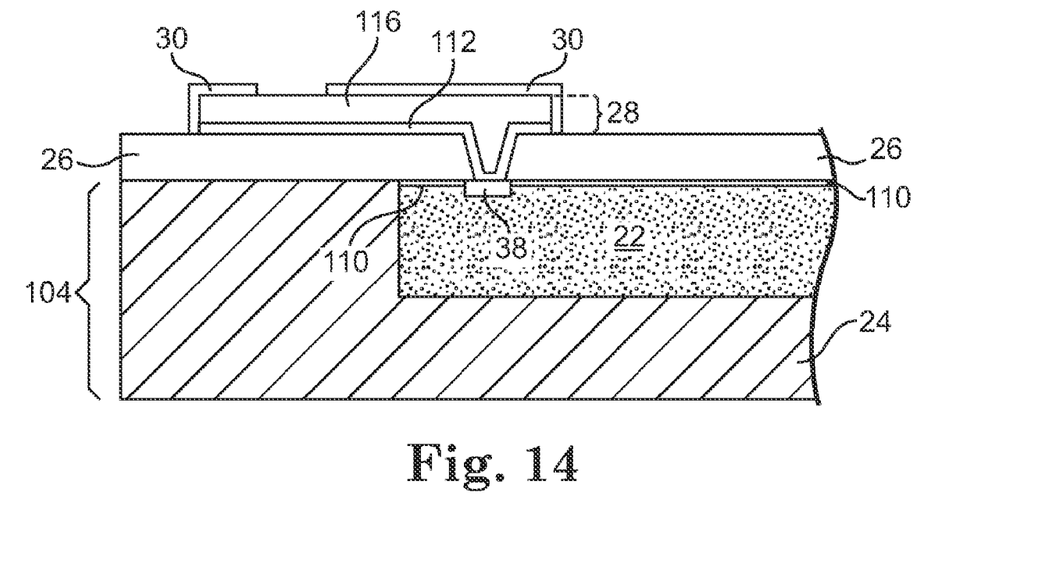
FIG. 14 is a diagram illustrating one embodiment of the assembly of FIG. 13 without plating resist.

FIG. 14 is a diagram illustrating one embodiment of the assembly of FIG. 13 without plating resist 118. Plating resist 118 is stripped to expose the protected portion of conductive layer 28, i.e. the landing pad for one of the metal elements 32.

Figure 15:
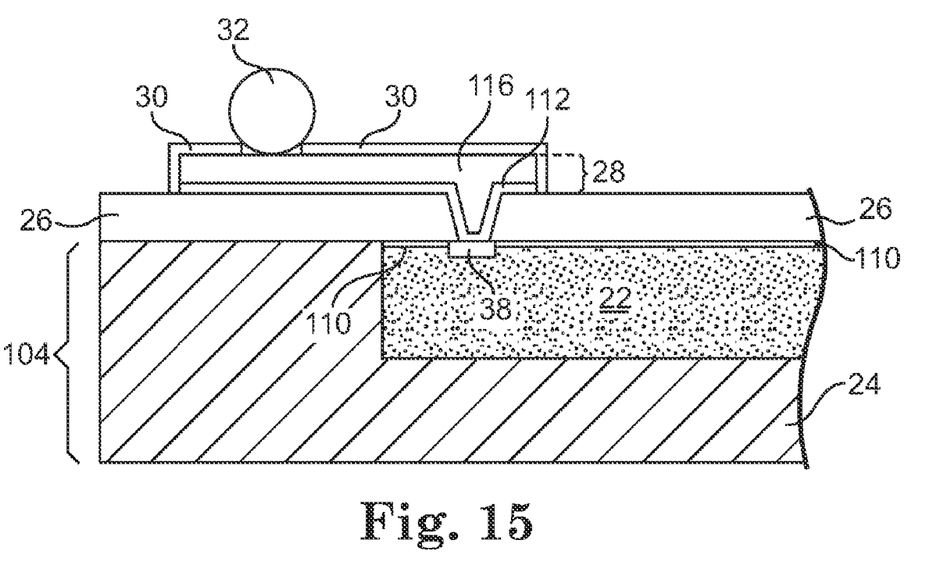
FIG. 15 is a diagram illustrating one embodiment of one of the metal elements connected to a conductive layer.

FIG. 15 is a diagram illustrating one embodiment of one of the metal elements 32 connected to conductive layer 28. Metal elements 32 are connected via fluxing, applying the metal elements 32 and reflowing solder, where copolymer 30 acts as a solder stop to stop the flow of solder. In one embodiment, metal elements 32 protrude greater than 100 micrometers from conductive layer 28. In one embodiment, the metal elements 32 are solder including tin, silver and copper. In one embodiment, the metal elements 32 are solder balls. In one embodiment, the metal elements 32 are solder bumps. In one embodiment, the metal elements 32 are solder studs.

After connecting metal elements 32, the molded body 104 is diced to provide eWLB semiconductor devices similar to semiconductor device 20 of FIG. 1. Other WLB semiconductor devices similar to semiconductor device 50 of FIG. 2 are manufactured via the process described in the description of FIGS. 8-15.

Using a copolymer layer 30 of less than 1 micrometer in thickness reduces warpage of the resulting semiconductor device. This allows thicker insulating layers, such as insulating layer 26, which increases integrated circuit performance.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device comprising:
 a chip having a contact side and other sides and comprising an integrated circuit;

mold material on at least one of the other sides of the chip and having a surface flush with the contact side of the chip;

an insulating layer on the contact side of the chip and on the surface of the mold material flush with the contact side of the chip, wherein the insulating layer is in direct contact with the contact side of the chip and the insulating layer is in direct contact with the surface of the mold material flush with the contact side of the chip;

a conductive layer on the insulating layer and electrically coupled to the integrated circuit, wherein the insulating layer is situated between the conductive layer and the mold material;

a copolymer layer on the conductive layer and in contact with a surface of the insulating layer, wherein a portion of the surface of the insulating layer is not covered by the conductive layer or the copolymer layer; and metal elements electrically coupled to the conductive layer via through-connects in the copolymer layer.

2. The semiconductor device of claim 1, wherein the copolymer layer has a thickness of less than 1 micrometer.

3. The semiconductor device of claim 1, wherein the conductive layer includes structured copper and the copolymer layer is disposed on the structured copper.

4. The semiconductor device of claim 1, wherein the metal elements protrude from the conductive layer at least 100 micrometers.

5. The semiconductor device of claim 1, wherein the metal elements are one of solder balls, solder bumps and solder studs.

6. A semiconductor device comprising:

a semiconductor chip having a contact side and other sides;

mold material on the other sides of the chip and having a surface flush with the contact side of the chip;

an insulating layer on the contact side of the chip and on the surface of the mold material flush with the contact side of the chip, wherein the insulating layer is in direct contact with the contact side of the chip and the insulating layer is in direct contact with the surface of the mold material flush with the contact side of the chip;

a redistribution layer on the insulating layer and electrically coupled to the contact side, wherein a portion of the redistribution layer extends beyond the perimeter of the semiconductor chip and the insulating layer is situated between the portion of the redistribution layer that extends beyond the perimeter of the semiconductor chip and the mold material;

a copolymer layer disposed on the redistribution layer and in contact with a surface of the insulating layer, wherein the redistribution layer and the copolymer layer leave uncovered a portion of the surface of the insulating layer; and metal elements electrically coupled to the redistribution layer via through-connects in the copolymer layer.

7. The semiconductor device of claim 6, wherein the copolymer layer has a thickness of less than 1 micrometer.

8. The semiconductor device of claim 6, wherein the metal elements protrude from the conductive layer at least 100 micrometers.

9. The semiconductor device of claim 6, wherein the redistribution layer includes structured copper and the copolymer layer is disposed on the structured copper.

* * * * *